United States Patent [19]

Mahadevan et al.

[11] Patent Number: 5,686,698

[45] Date of Patent: Nov. 11, 1997

[54] PACKAGE FOR ELECTRICAL COMPONENTS HAVING A MOLDED STRUCTURE WITH A PORT EXTENDING INTO THE MOLDED STRUCTURE

[75] Inventors: Dave S. Mahadevan, Mesa; D. Lawrence Boughter, Tempe, both of Ariz.

[73] Assignee: Motorola, Inc., Schaumburg, Ill.

[21] Appl. No.: 269,254

[22] Filed: Jun. 30, 1994

[51] Int. Cl.$^6$ .............. H01L 23/02; H01L 31/0203
[52] U.S. Cl. .............. 174/52.4; 257/433; 257/434; 257/693; 257/787; 257/666; 257/670; 361/760; 361/772; 361/813
[58] Field of Search .............. 174/52.4, 52.1, 174/52.2, 52.3; 257/666, 667, 670, 693, 696, 702, 704, 787, 712–714, 721, 432–434; 361/723, 772, 813, 820, 760

[56] References Cited

U.S. PATENT DOCUMENTS

| | | | |
|---|---|---|---|
| 4,158,745 | 6/1979 | Keller | 174/52.4 |
| 4,180,161 | 12/1979 | Henrickson et al. | 206/328 |
| 4,252,864 | 2/1981 | Coldren | 428/571 |
| 4,556,896 | 12/1985 | Meddles | 174/52.4 |
| 4,777,520 | 10/1988 | Nambu et al. | 174/52.4 X |
| 4,809,054 | 2/1989 | Waldner | 29/827 X |
| 4,855,807 | 8/1989 | Yamaji et al. | 174/52.4 X |
| 4,945,634 | 8/1990 | Kumada | 29/854 |
| 5,208,467 | 5/1993 | Yamazaki | 257/667 |
| 5,221,642 | 6/1993 | Burns | 437/207 |
| 5,365,108 | 11/1994 | Anderson et al. | 257/678 |
| 5,376,026 | 12/1994 | Ohashi | 439/885 |
| 5,436,492 | 7/1995 | Yamanaka | 257/433 |
| 5,483,098 | 1/1996 | Joiner, Jr. | 257/676 |
| 5,491,362 | 2/1996 | Hamzehdoost et al. | 257/712 |

*Primary Examiner*—Bot L. Ledynh
*Attorney, Agent, or Firm*—Rennie William Dover

[57] ABSTRACT

A package for mounting electrical components and a method for making the package. A mold structure (50) is formed by encapsulating a portion of a leadframe (10) with a molding compound. Leads (23) project from one side of the mold structure and a portion of a tab (27) projects from another side of the mold structure, which has a cavity (57) between the leads (23) and the tab (27). In addition, the mold structure has vent holes (76) between the leads (23) and an aperture (62) extending to the cavity. After mounting a semiconductor chip (64) in the cavity (57), it is covered by a lid (53) and a portion (24) of the leads (23) and a portion (29) of the tab (27) are formed. The tab (27) provides structural rigidity to the mold structure (50) and permits surface mounting the mold structure (50).

16 Claims, 3 Drawing Sheets

5,686,698

1

PACKAGE FOR ELECTRICAL COMPONENTS HAVING A MOLDED STRUCTURE WITH A PORT EXTENDING INTO THE MOLDED STRUCTURE

BACKGROUND OF THE INVENTION

The present invention relates, in general, to a package, and more particularly, to a package for an electrical component.

Packaging electrical components entails a multitude of processing steps that are tailored to the type of electrical component being packaged and the type of package desired. For example, steps for packaging a semiconductor chip in a single-in-line package typically include: mounting the semiconductor chip to a leadframe, coupling bonding pads on the semiconductor chip with corresponding leadframe leads, encapsulating the semiconductor chip and a portion of the leadframe with a molding compound, and trimming and forming the leadframe. A pressure sensing integrated device, on the other hand, is typically packaged in a single-in-line package by mounting it to a molded structure, coupling bonding pads on the pressure sensing integrated device with corresponding leadframe leads, securing a cap to the molded structure, and trimming and forming the leads. Although single-in-line packages are useful for packaging electronic components, they are difficult to mount on substrates such as printed circuit boards using techniques such as infra red (IR) reflow soldering techniques.

Accordingly, it would be advantageous to have a method and a means for packaging an electronic component that enables mounting the electronic component to printed circuit boards using IR reflow solder techniques. It would be of further advantage for the package to be suitable for packaging active components such as sensors and passive components such as capacitors.

DETAILED DESCRIPTION OF THE DRAWINGS

Generally, the present invention provides a method and a means for packaging active and passive electrical components such as integrated devices and capacitors, respectively. In accordance with the present invention, a package is fabricated having leads extending from one side of the package and a tab extending from another side of the package. Preferably the tab is electrically isolated from the leads. The tab makes possible surface mounting electrical components packaged in single-in-line packages.

Figure 1:
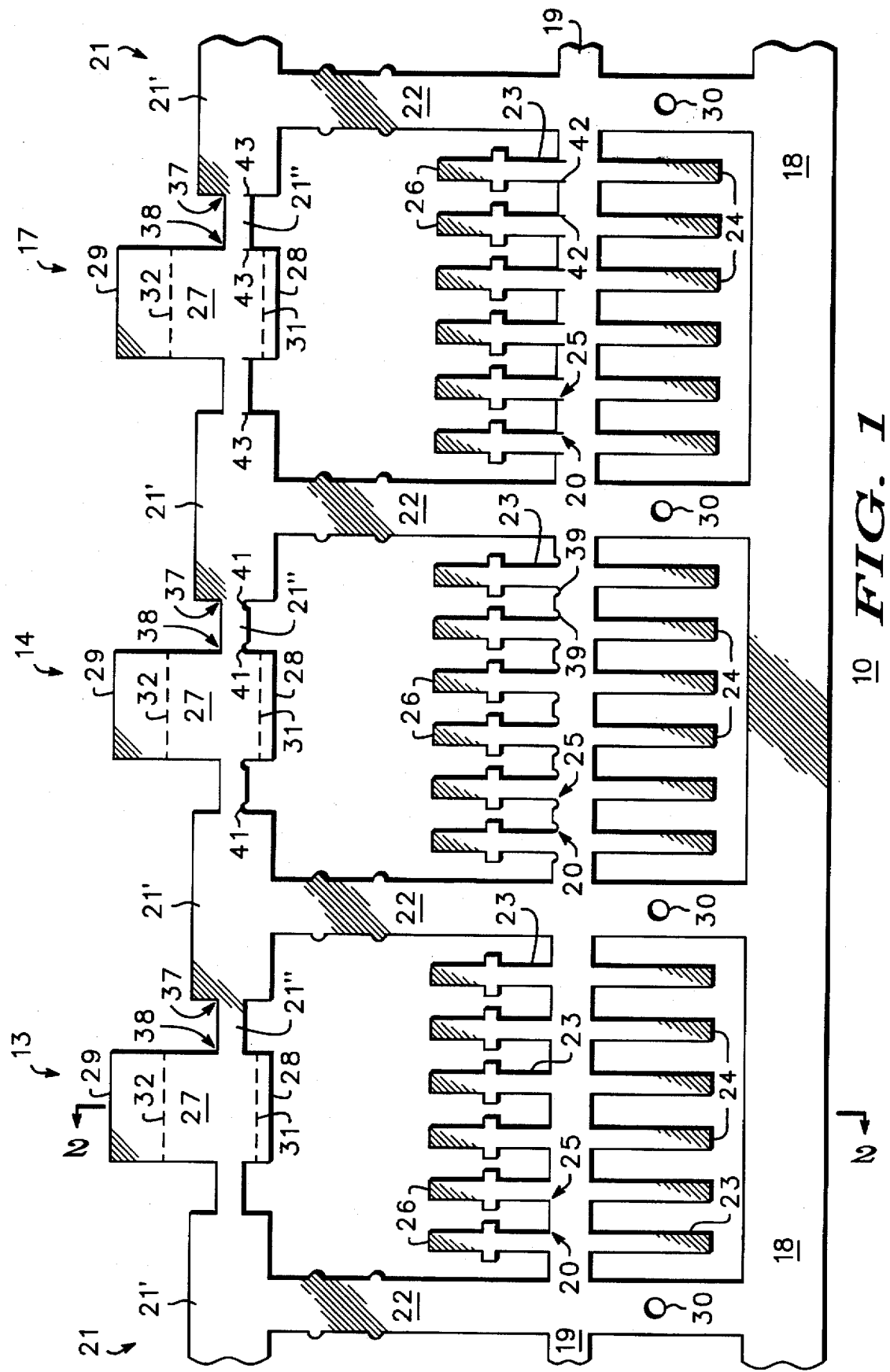
FIG. 1 illustrates a top view of a portion of leadframe in accordance with a first embodiment of the present invention.

FIG. 1 illustrates a top view of a portion of a semiconductor leadframe 10 comprising three individual leadframe configurations, wherein each leadframe configuration represents a separate leadframe embodiment. As those skilled in the art are aware, a single semiconductor leadframe typically comprises a single leadframe embodiment having a plurality of portions held together by tie strips and a connecting band. After encapsulation, the leadframe is separated or singulated

2 into individual portions. However, it should be understood that the three leadframe embodiments have been combined into a single leadframe 10 in FIG. 1 to facilitate a description of the present invention.

A first embodiment of a leadframe of the present invention is shown in the left-hand portion of semiconductor leadframe 10, hereby defined herein as first leadframe portion 13. Likewise, a second embodiment of a leadframe of the present invention is shown in a middle portion of semiconductor leadframe 10 which is hereby defined herein as second leadframe portion 14. Further, a third embodiment of a leadframe of the present invention is shown in the right-hand portion of semiconductor leadframe 10 which is hereby defined herein as third leadframe portion 17. Leadframe portions 13, 14, and 17 are held together by a connecting band 18, a dam bar 19, a dam bar 21, and tie strips 22. Connecting band 18 and dam bars 19 and 21 are substantially parallel to one another and tie strips 22 are substantially perpendicular to connecting band 18 and dam bars 19 and 21. However, it should be understood that the spatial relationship of connecting band 18, dam bars 19 and 21, and tie strips 22 is not a limitation of the present invention. In addition, either connecting band 18, or tie strips 22, or their junction points have indexing holes 30 which are used to move or index the leadframe during the steps of forming a package and packaging an electronic component.

First leadframe portion 13 comprises two substantially parallel tie strips 22 coupled at three locations by conducting band 18 and dam bars 19 and 21. More particularly, tie strips 22 are coupled at one end by conducting band 18, at one end by dam bar 21 and at a central position by dam bar 19. A plurality of leads 23 having first and second ends 24 and 26, respectively, extend through dam bar 19. First ends 24 are coupled to second ends 26 by central portions. First ends 24 serve as surface mount bonding ends and second ends 26 serve as interconnect bonding ends. Although six leads are shown in first leadframe portion 13, it should be understood that the number of leads is not a limitation of the present invention and that the present invention is applicable to inventions having more or less than six leads.

The intersection or junction of two adjacent leads with dam bar 19 forms a first corner 20 and a second corner 25 with the portion of the dam bar which is between these two adjacent leads. In other words, corner 20 is formed by a junction of a first of the two adjacent leads of the plurality of leads with a portion of dam bar 19 which is between the two adjacent leads and corner 25 is formed by a junction of a second of the two adjacent leads with another portion of the dam bar which is between the two adjacent leads.

Dam bar 21 comprises a first or wide portion 21' and a second or narrow portion 21". A tab 27 having first and second ends 28 and 29, respectively, extends through narrow portion 21". First end 28 serves as a fastening end and second end 29 serves as a surface mount bonding end. A corner 37 is formed at an intersection of wide portion 21' and narrow portion 21". In addition, a corner 38 is formed at an intersection of tab 27 and narrow portion 21". Tab 27 having ends 28 and 29 will be further described with reference to FIGS. 2–4. Techniques for manufacturing first leadframe portion 13 are well known to those skilled in the art.

After manufacturing first leadframe portion 13, a portion of tab 27 adjacent end 28 is coined or formed to have a bend. By way of example, the bend forms an angle of approximately ninety degrees; however, the angle of the bend is not a limitation of the present invention. The bend is illustrated by dashed line 31. In addition, a portion of tab 27 adjacent end 29 is coined or formed to have an L-shape. Dashed lines 32 indicate the portions of tab 27 that are coined to have bends that form the L-shape. Techniques for coining or forming portions of a leadframe are well known to those skilled in the art.

Figure 2:
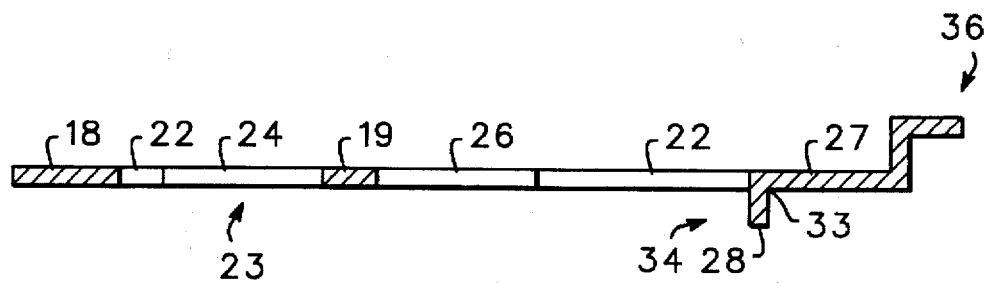
FIG. 2 illustrates a cross-sectional view along section line 2—2 of the leadframe of FIG. 1.

FIG. 2 illustrates a cross-sectional view (through section lines 2—2 of FIG. 1) of first leadframe portion 13 after tab 27 has been coined. What is shown in FIG. 2 is a portion of connecting band 18, portions of tie strip 22, portions of ends 24 and 26 of a lead 23, a portion of dam bar 19, and a portion of tab 27. More particularly, FIG. 2 shows tab 27 after it has been coined, thereby illustrating bend 33 adjacent end 28. It should be understood that the portion 34 of tab 27 may point in a downward direction as shown in FIG. 2 or in an upward direction (not shown), i.e., a direction opposite the direction shown in FIG. 2. In addition, L-shaped portion 36 adjacent end 29 is shown. By way of example, bend 33 and L-shaped portion 36 may be formed using a punch and die.

Referring again to FIG. 1 and in accordance with a second embodiment of the present invention, dam bar 19 has two semicircular notches 39 between adjacent leads that are spaced apart from each other and extend into dam bar 19. One terminus of a radial line of one semicircular notch 39 is at corner 20 and one terminus of a radial line of another semicircular notch 39 is at corner 25. Likewise, portion 21" of dam bar 21 has semicircular notches 41 that are spaced apart from each other and extend into dam bar 21. One terminus of a radial line of one semicircular notch 41 is at corner 37 and one terminus of a radial line of another semicircular notch 41 is at corner 38. Semicircular notches 39 may be made using a punch and die. Preferably, semicircular notches 39 and 41 are made simultaneously. Techniques for making semicircular notches 39 and 41 are well known to those skilled in the art and include piercing, notching, etc.

In accordance with the third embodiment of the present invention, second leadframe portion 17 has two slits 42 spaced apart from each other and between adjacent leads. Slits 42 extend a desired distance into a portion of dam bar 19 between corners 20 and 25. Likewise, portion 21" of dam bar 21 has slits 43 spaced apart from each other and extending into dam bar 21. By way of example, slits 42 make an angle of approximately 90 degrees with an edge of dam bar 19 and slits 43 make an angle of approximately 90 degrees with an edge of dam bar 21. It should be understood that the angle slits 42 and 43 make with the edges of dam bars 19 and 21, respectively, is not a limitation of the present invention. It should be noted that notches 39 and 41 and slits 42 and 43 serve to prevent burr formation during a dam bar removal step.

Figure 3:
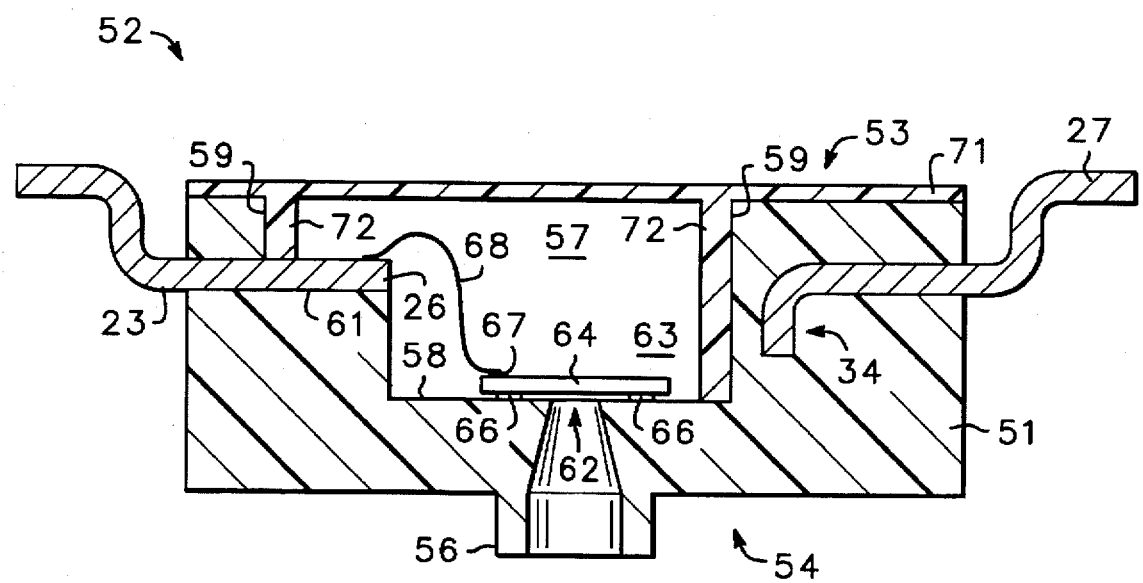
FIG. 3 illustrates a cross-sectional view of a portion of an embodiment of a sensor package in accordance with the present invention using the leadframe of FIG. 2.

FIG. 3 illustrates a cross-sectional view of a portion of an embodiment of a sensor package 50 comprising first leadframe portion 13. First leadframe portion 13 is placed in a mold (not shown) and a molding compound is injected into the mold to form a molded structure or body 51. Molded structure 51 comprises a top side 52 having a lid 53 and a bottom side 54 having a nipple 56. Further, the mold is shaped so that the molding compound encases the central portion of leads 23 and portion 34 of tab 27. In other words, a portion of molded structure 51 is bonded to the central portion of leads 23 and to portion 34 of tab 27. Portion 34 serves to secure tab 27 in molded structure 51. In addition, molded structure 51 comprises a cavity 57 having a floor 58, sidewalls 59 and a ledge 61. Ends 26 of leads 23 rest on ledge 61. Further, portions of ledge 61 between ends 26 have vent holes 76 extending through bottom side 54 (shown in FIG. 4). As those skilled in the art are aware, vent holes 76 permit an ambient environment surrounding sensor package 50 to enter cavity 57.

An aperture 62 extends from a portion of floor 58 through molded structure 51 to bottom 54. Aperture 62 is aligned with nipple 56. The portion of floor 58 containing aperture 62 serves as an electrical component receiving area 63. A semiconductor chip 64 is bonded to electrical component receiving area 63 with an adhesive 66. Preferably adhesive 66 is a silicone rubber adhesive that is heat curable, capable of being dispensed from a nozzle at room temperatures, bondable to a plastic package and a semiconductor chip, and capable of isolating stresses from the plastic package and the semiconductor chip. In accordance with the sensor embodiment, semiconductor chip 64 is a sensor element that is positioned to cover aperture 62. Accordingly, adhesive 66 preferably provides an air-tight seal between semiconductor chip 64 and floor 58. By way of example, semiconductor chip 64 is a pressure sensor having part number DXL4104BSP or DXL2300V1.

Bonding pads 67 are coupled to corresponding ends 26 of leads 23 by metal wires 68, commonly referred to as wirebonds. Suitable materials for metal wires 68 include gold, copper, aluminum, and the like.

Lid 53 is mounted to molded structure 51 to cover cavity 57. By way of example, lid 53 is a molded structure made from the same material as molded structure 51 and comprising a flat plate 71 having projections or feet 72. Lid 53 is press-fit onto molded structure 51 such that projections 72 mate fit snugly against corresponding sidewalls 59. Preferably, projections 72 adjacent sidewall 59 on the side of sensor package 50 having leads 23 are in contact with ends 26. Further, projections 72 adjacent sidewall 59 on the side of sensor package 50 having tab 27 do not contact adhesive 66 or semiconductor chip 64. Alternatively, lid 53 may be ultrasonically welled to molded structure 51.

Figure 4:
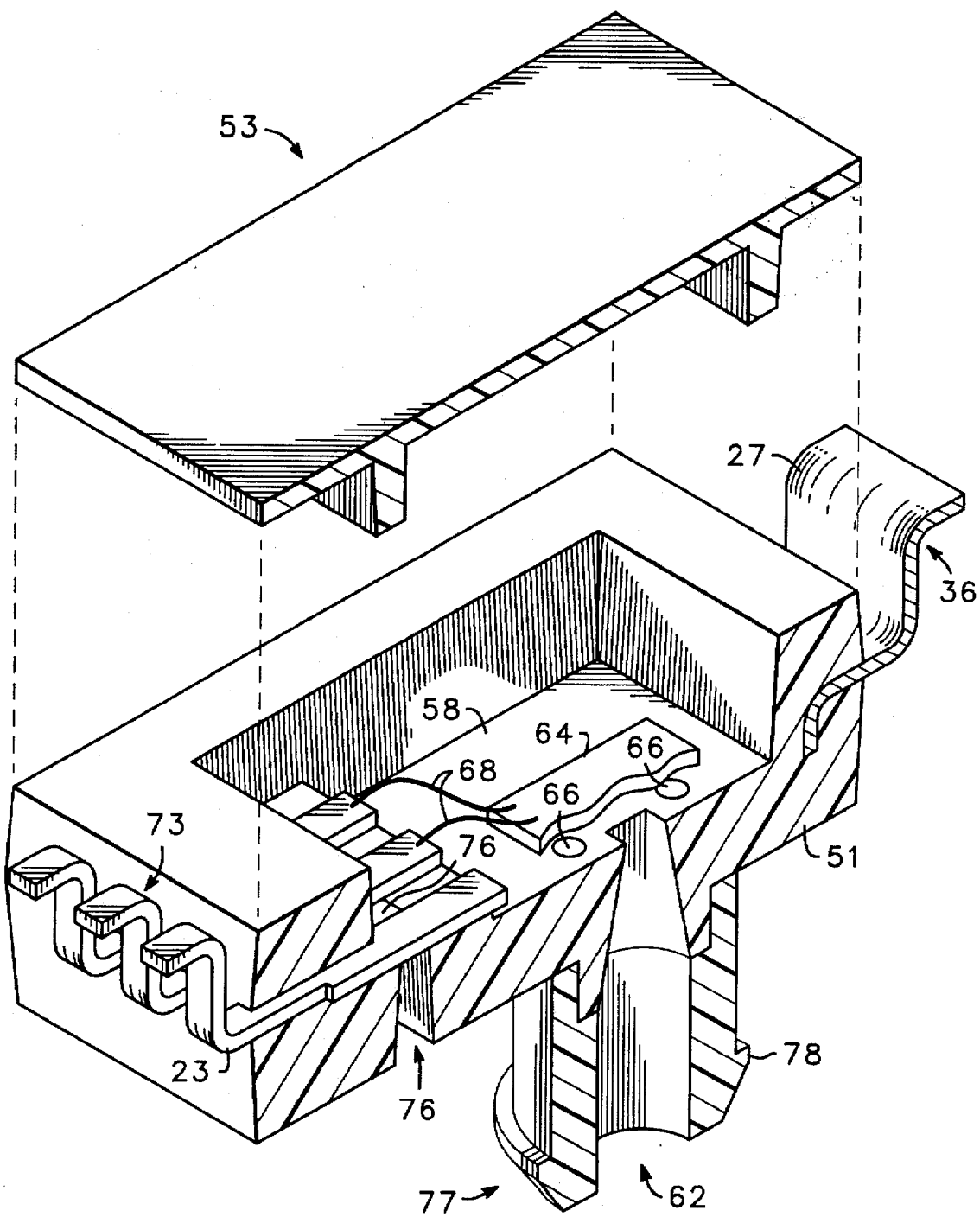
FIG. 4 illustrates an exploded isometric view of the sensor package of FIG. 3.

FIG. 4 illustrates an exploded isometric view of the sensor package of FIG. 3. What is shown in FIG. 4 is the sensor package 50 having a molded structure 51 and a lid 53. FIG. 4 further shows leads 23 and tab 27 encased in molded structure 51 and L-shaped portions 36 and 73 of tab 27 and leads 23, respectively. In addition, semiconductor chip 64 is coupled to floor 58 by adhesive 66 and covers aperture 62. Leads 23 are coupled to corresponding bonding pads on semiconductor chip 64 by wires 68.

In addition, vent holes 76 are illustrated in molded structure 51. Although vents holes 76 are shown as being between adjacent leads 23, it should be understood this is not a limitation of the present invention. Other suitable locations for vent holes 76 include lid 53, sidewalls 59, and portions of floor 58 adjacent electrical component receiving area 63.

A portion 73 of lead 23 adjacent end 24 is coined or formed to have an L-shape corresponding to the L-shaped portion 36 of tab 27. L-shaped portions 36 and 73 serve to contact bonding pads on, for example, printed circuit boards (not shown). The L-shape portion 36 of tab 27 in cooperation with the L-shaped portion 73 of lead 23 permit surface mounting sensor package 50 to, for example, a printed circuit board using such techniques as IR solder reflow. It should be understood that the L-shaped portions may face in an opposite to direction to that shown in FIG. 3.

FIG. 4 further illustrates a nozzle 77 having a lip 78. Nozzle 77 is capable of mating with a hose (not shown) for delivering a medium to semiconductor chip 64. The medium exerts a pressure on the side of semiconductor chip 64 adjacent aperture 62. Subsequently, semiconductor chip 64 develops an electrical signal in accordance with the difference in pressure between cavity 57 and the side of semiconductor chip 64 adjacent aperture 62. Thus, sensor package 50 serves as a package for a pressure sensor.

By now it should be appreciated that a method and means for manufacturing a package that can be surface mounted to a substrate, such as a printed circuit board, using techniques such as IR reflow soldering has been provided. In accordance with one embodiment of the present invention, a tab is molded into one side of a mold structure, wherein the tab is electrically isolated from leadframe leads. In addition, the tab provides structural rigidity for surface mounting the package. Further, the package includes vent holes, which may be between leads, through leads or in a central portion of the package. Optionally, the package includes a separate cap and port. A hose may be attached to the port, wherein the hose delivers a liquid to a pressure sensor within the package.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the vent holes may be formed through the leads of the leadframe or the leadframe may include a flag.

We claim:

1. A package for electrical components, comprising:

a support structure having a first side, a second side, and an electrical component receiving area, wherein the support structure comprises a molded structure having a cavity and a port extending through the molded structure and contacting the electrical component receiving area, and wherein a portion of the cavity serves as the electrical component receiving area;

at least one lead having a first end and a second end, the at least one lead extending into the support structure from the first side, wherein the first end is external to the support structure; and at least one tab having a first end and a second end, the at least one tab electrically isolated from the electrical component receiving area and extending into the support structure from the second side, wherein the first end is external to the support structure.

2. The package of claim 1, wherein the support structure further includes a cap which covers at least the cavity.

3. The package of claim 1, wherein the molded structure further includes at least one vent hole extending through the molded structure to the cavity.

4. The package of claim 3, wherein the at least one lead comprises a plurality of leads and the at least one vent hole is between two adjacent leads of the plurality of leads.

5. The package of claim 1, wherein a portion of the at least one lead is L-shaped and a portion of the at least one tab is L-shaped.

6. The package of claim 1, wherein an integrated device is mounted to the electrical component receiving area.

7. A package for electrical components, comprising:

a support structure having a first side, a second side, and an electrical component receiving area;

at least one lead having a first end and a second end, the at least one lead extending into the support structure from the first side and having a vent hole adjacent thereto and extending into the support structure, wherein the first end is external to the support structure; and at least one tab having a first end and a second end, the at least one tab extending into the support structure from the second side, wherein the first end is external to the support structure, and wherein the at least one tab is electrically isolated from the electrical component receiving area and the at least one lead.

8. The package of claim 7, further including an integrated device mounted in the electrical component receiving area.

9. The package of claim 8, wherein the tab is electrically isolated from the electrical component.

10. A pressure sensor device, comprising:

a lead-support structure having a first sidewall, a second sidewall, an electrical component receiving area, and a vent hole extending therein;

an electrical component mounted in the electrical component receiving area;

a first lead having an interconnect bonding end coupled to a surface mount end by a central portion, the lead extending through the first sidewall and adjacent the vent hole; and a tab having a surface mount end and a fastening end, wherein the fastening end cooperates with the lead-support structure to fasten the tab to the lead-support structure, and wherein the tab is electrically isolated from the electrical component receiving area.

11. The pressure sensor device of claim 10, wherein the lead-support structure further includes a lid for covering the cavity.

12. The pressure sensor device of claim 11, wherein the lead-support structure includes a port, and an integrated device having a bonding pad disposed thereon is mounted to the lead-support structure, the integrated device aligned with the port.

13. The pressure sensor device of claim 10, wherein the lead-support structure includes a port having a nipple extending therefrom.

14. The pressure sensor device of claim 10, wherein the package further includes a second lead having an interconnect bonding end coupled to a surface mount end by a central portion and the electrical component mounted to a portion of the lead-support structure, the electrical component having a first portion coupled to the interconnect bonding portion of the first lead and a second portion bonded to the interconnect bonding portion of the second lead.

15. The pressure sensor device of claim 14, wherein the electrical component is selected from the group of passive components and active components.

16. The pressure sensor device of claim 10, wherein the tab is electrically isolated from the electrical component.

* * * * *